(12) United States Patent
Lipson

(10) Patent No.: US 7,251,261 B2
(45) Date of Patent: Jul. 31, 2007

(54) TEMPERATURE TUNING THE WAVELENGTH OF A SEMICONDUCTOR LASER USING A VARIABLE THERMAL IMPEDANCE

(75) Inventor: Jan Lipson, Cupertino, CA (US)

(73) Assignee: C8 Medisensors Inc., San Jose, CA (US)

( * ) Notice: Subject to any disclaimer, the term of this patent is extended or adjusted under 35 U.S.C. 154(b) by 34 days.

(21) Appl. No.: 11/129,165

(22) Filed: May 12, 2005

(65) Prior Publication Data
US 2006/0083273 A1    Apr. 20, 2006

Related U.S. Application Data

(60) Provisional application No. 60/570,762, filed on May 14, 2004.

(51) Int. Cl.
*H01S 3/04* (2006.01)

(52) U.S. Cl. .......................................... 372/34; 372/36
(58) Field of Classification Search ................ 372/36, 372/34, 32, 107
See application file for complete search history.

(56) References Cited

U.S. PATENT DOCUMENTS

| 5,181,214 | A | * | 1/1993 | Berger et al. | 372/34 |
| 5,265,115 | A | * | 11/1993 | Amano | 372/75 |
| 5,267,252 | A | * | 11/1993 | Amano | 372/34 |
| 5,392,303 | A | * | 2/1995 | Shiozawa et al. | 372/32 |
| 6,724,791 | B1 | * | 4/2004 | Chiappetta et al. | 372/36 |

* cited by examiner

*Primary Examiner*—Minsun Oh Harvey
*Assistant Examiner*—Tuan N. Nguyen
(74) *Attorney, Agent, or Firm*—Fenwick & West LLP

(57) ABSTRACT

An apparatus is described in which the temperature of a semiconductor laser (or other device) can be set to a desired value by using the heat generated by the laser itself in conjunction with an adjustable thermal impedance heat sink to effect the desired temperature rise.

24 Claims, 2 Drawing Sheets

TEMPERATURE TUNING THE WAVELENGTH OF A SEMICONDUCTOR LASER USING A VARIABLE THERMAL IMPEDANCE

CROSS-REFERENCE TO RELATED APPLICATION

This application claims priority under 35 U.S.C. § 119(e) to U.S. Provisional Patent Application Ser. No. 60/570,762, "Apparatus to temperature tune the wavelength of a semiconductor laser using a variable thermal impedance", filed May 14, 2004 by Jan Lipson.

BACKGROUND OF THE INVENTION

1. Field of the Invention

This invention relates generally to temperature control of devices by primarily passive mechanisms, for example as may be used to adjust the wavelength of a semiconductor laser by changing its temperature.

2. Background and Relevant Art

Semiconductor lasers have been tuned in wavelength through controlled variation in temperature. Two common means of changing the temperature are thermoelectric coolers and resistive heaters. Thermoelectric coolers typically use the Peltier effect. This device can either heat or cool depending on the direction of the electrical current flowing through the Peltier elements. A resistive heater is a resistor which converts electrical current to heat.

In either case, the method of temperature variation consumes considerable electrical power. In the case of a thermoelectric cooler, the Peltier effect has limited efficiency and the electric power consumption required for cooling is typically several times the power consumed in the laser. When the thermoelectric cooler is used as a heater, it is approximately as efficient as a resistor. While heating can then be more power efficient than cooling, it is still necessary to supply significant electrical power. This is so because it is in general not desirable to operate the laser at high temperatures. To avoid such operation, the laser is generally mounted in such a way that the thermal impedance to an appropriate heat sink is small. In consequence, to obtain a significant additional temperature rise from a heater which is located in proximity to the laser, it is necessary to generate heat of an order of magnitude that is significantly greater than is generated by the laser. If the heater is located downstream of the laser with respect to the heat flow, the situation is even worse, for in that case the thermal impedance to the heat sink is even smaller and more heat must be generated to effect the same temperature rise.

The additional power that must be provided for temperature tuning may not be acceptable in situations where power consumption is important, for example if the device is operated from a modest sized battery for a significant length of time.

Besides, the issue of power consumption, it may not be physically convenient to deploy the heater in proximity to the laser. If cost is a serious consideration and high volume standard parts such as Compact Disk (CD) lasers are desirable to be used, it may be necessary to break open the packaging to add the heater. Thus, there is a need for approaches that would enable the laser to be temperature tuned, without disturbing the packaging in which it may be readily purchased.

U.S. Pat. No. 5,371,753 discloses an apparatus in which the thermal impedance of a laser diode heat sink varies during the turn-on cycle of the laser. The variation is accomplished through use of a metal structure and an air-gap, which metal structure by virtue of its dimensions is open while the laser is warming up, and closes when the temperature has reached the range of desired values. The closure is accomplished by virtue of reversible deformations arising from temperature changes such as may be obtained with shape-memory alloy metals. While this approach can allow the laser to reach a specific temperature range, there is no means by which the temperature that is ultimately reached can be varied significantly or controlled precisely. The thermal impedance is not adjustable during device operation. It is fixed during fabrication of the device and this, in turn, fixes the temperature range.

U.S. Pat. No. 6,243,404 discloses a laser module that can be tuned over a temperature range and different temperature ranges can be selected during fabrication. The temperature range is selected by inserting spacers of known thermal impedance between the laser and the ultimate heat sink such that the laser temperature can be made to rise by a fixed known amount above ambient. Then, a secondary control mechanism such as a thermoelectric cooler can adjust the laser temperature over a range in the vicinity of the base laser temperature. In this approach, the thermal impedance (and therefore the base laser temperature) is selected at the time of device fabrication and is afterwards fixed. The temperature cannot then later be further adjusted through variations in the thermal impedance and this approach depends on previously described cooling or heating schemes, with their consequent inefficiencies, to accomplish the required temperature adjustments during device operation.

Thus, there is a need to control the temperature of devices, such as semiconductor lasers, in a manner that consumes less energy than current approaches.

BRIEF SUMMARY OF THE INVENTION

These and other limitations are addressed by the present invention, which discloses an apparatus whereby a laser (or other active device) can be temperature tuned using preferentially the heat already generated by the laser in conjunction with a heat sink which thermal impedance can be adjusted.

In one application, this approach is used to controllably tune the wavelength of a semiconductor laser. The heat generated in the laser itself, that is a by-product of its emission, is used to increase the temperature of the laser by an amount which is adjustable using a variable thermal impedance. The wavelength of the laser is thereby adjusted to the desired value by means of the variation of wavelength with temperature.

In one implementation, the overall heat sink has two portions. One portion is thermally coupled to the laser and the other portion is well coupled to the environment. The two portions may be thermally coupled or decoupled to each other and they are coupled for an average time determined by the desired heat flow. Latching type relays can be used to accomplish the required coupling/decoupling with low additional power consumption. When the two portions of the heat sink are not coupled to each other, the temperature of the semiconductor laser will rise because of the heat generated by the laser itself. When the desired temperature is obtained, the two heat sink portions will couple to each other for that fraction of time which is appropriate to yield an average thermal impedance, which in conjunction with the laser heat, stabilizes the temperature at the desired point.

In an alternate design, the two heat sink portions are in thermal contact with each other but the contact area is adjustable, thus changing the overall thermal impedance. For example, the contact area may be determined by a deformable material or liquid, which can then be adjusted to change the contact area.

A secondary heater (e.g., a resistive heater) can be deployed on the laser assembly to shorten the time required to reach a higher temperature. This can be done with little energy penalty because the heater is only on during warm-up (or when other significant rises in temperature are desired) and can thereafter be turned off.

Different control mechanisms may also be used. In one approach, a temperature sensor is deployed on the laser assembly such that the system can be operated in a closed control loop, a controller is coupled to the temperature sensor and adjusts the thermal impedance of the heat sink to maintain a given temperature. In an alternate approach, a wavelength sensor is used to provide direct feedback from the output of the laser. A controller adjusts the thermal impedance of the heat sink to maintain a given wavelength. Controllers can also operate the heat sink in an open loop manner.

One advantage of this approach is that the temperature control is primarily passive (i.e., not primarily by use of active external heaters or coolers). Therefore, less power is consumed. In addition, in certain implementations, the device can be tuned over a range of temperatures or, in the semiconductor laser example, the semiconductor laser can be tuned over a range of wavelengths.

Other aspects of the invention include methods corresponding to the devices and systems described above, and application to devices other than semiconductor lasers and for purposes other than wavelength tuning.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
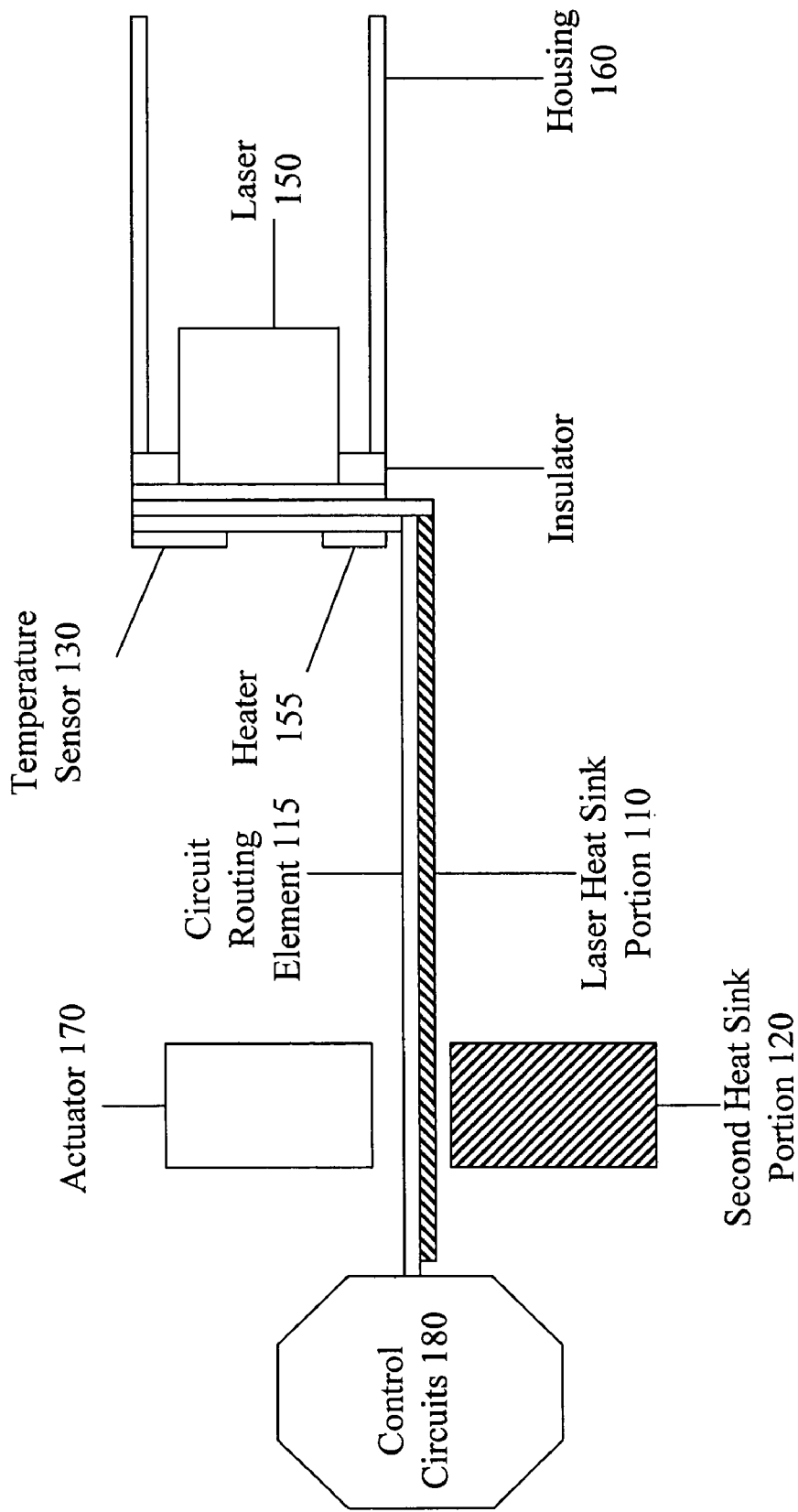
FIG. 1 is a diagram of an apparatus where adjustable thermal impedance is achieved by intermittent contact between different parts of the heat sink.

FIG. 1 is a diagram of an apparatus where adjustable thermal impedance is achieved by intermittent contact between different parts of a heat sink. In this example, the heat sink is implemented in two parts, which will be referred to as the laser heat sink 110 and the second heat sink 120. The semiconductor laser 150 is contacted by the laser heat sink 110, but insulated from the housing 160 such that the heat flow is predominantly through the heat sink. The heat sink 110 can be thermally coupled to the second heat sink 120 by virtue of an actuator 170 which drives the two parts together. In one design, the actuator 170 is a solenoid.

Although FIG. 1 shows a case where the laser heat sink 110 is deflected onto the second heat sink 120 when the actuator 170 is extended, in an alternate approach, the position of the laser heat sink 110 is fixed and the actuator 170 is used to move the second heat sink 120 into contacting position.

In one design, the laser heat sink portion 110 is part of an integrated assembly which also contains conductive traces 115 for the purpose of establishing useful circuits. In one approach, these circuits 115 preferentially include connections to a temperature sensor 130 that senses the temperature of the semiconductor laser 150. Using the temperature which is obtained from the sensor 170, the control circuits 180 can perform operations appropriate to arriving quickly at a desired temperature and stabilizing the temperature at that point.

The control circuits 180 perform the operation of deciding when the heat sink portions 110, 120 are in contact and for how long. The temperature rise in equilibrium of the laser 150 is governed by the following relationships $$\Delta T = Z H \quad (1)$$

where $\Delta T$ is the temperature rise of the laser 150 above the temperature of the second heat sink portion 120 (which is assumed in this example to be at a constant temperature), Z is the effective thermal impedance from the laser 150 to the heat sink portion 120, and H is the heat being dissipated by the laser 150 in equilibrium. It is assumed here that parallel paths of heat conduction wherein heat is not conducted through the laser heat sink portion 110, are made negligible by design, as is generally desired.

If the two portions 110, 120 of the heat sink are connected for a time $t_i$ out of a total time $t_i$, the effective thermal impedance can be approximated as:

$$Z = t_t/t_I Z_C \quad (2)$$

where $Z_C$ is the thermal impedance from the laser 150 to the second heat sink portion 120 when the actuator 170 connects the two portions 110, 120. Through adjustment of the connect time $t_I$ (or the duty cycle $t_I/t_t$) the desired value of Z can be achieved such that the temperature rise $\Delta T$ is that which is desired.

The time $t_t$ preferably should be selected on the basis of restricting the variation of the temperature of the laser assembly from the desired temperature, during both the connected time $t_I$ and the time not connected ($t_t-t_I$). Variations arise because the thermal impedance is adjusting from the average impedance during these times. The laser assembly is composed of an ensemble of materials with different masses and heat capacities. However, it can be considered to have a thermal mass which is the sum of the products of each mass with the heat capacity appropriate for that material. The assembly will rise in temperature in a given time by an amount which is proportional to the laser heating, H, and inversely proportional to the thermal mass of the whole assembly. If temperature variations are desired to be less than a set value, $T_v$, the time when the heat sinks are not connected ($t_t-t_I$) should be less than the time required for the assembly to rise in temperature by $T_v$.

A second criterion for setting the time $t_t$ could emerge from the observation that the thermal impedance is less than the desired average during the interval $t_I$, and, hence, the temperature will be lower than the average near the end of the connection interval. In a preferred embodiment, however, where substantially all the heat flows between the two heat sink portions 110, 120, the temperature variations during intervals of disconnection will be larger than the temperature variations during periods of connection. That is because the thermal impedance in disconnection is assumed to be very large by virtue of proper insulation. Accordingly, the criterion based on variations during disconnection will typically be more stringent.

The actuator 170 can be chosen to be a relay type electrical device wherein a suitable current is supplied to effect connection and a second suitable current is supplied to effect disconnection. In a preferred embodiment, the relay is latching in the actuator 170 position that is reached as a result of application of current. In that case, the current can be discontinued and no further power is required to retain the actuator 170 position. When the actuator 170 is desired to be returned to its initial position, a second current is applied which releases the latch Relays can be based on conventional solenoids, but are not restricted to be so. It is also possible to use other types of actuators 170 which have essentially the same mechanical function. These can include MEM actuators, piezoelectric actuators, motor driven actuators, and other actuators which produce the necessary deflections and forces. Preferably, the average power consumption is less than or of the order of that of the laser. As this invention is applicable to lasers of many different powers, the choice of actuator depends in part on the laser. Conventional solenoid type relays, however, generally work well over a broad range of laser choices and can be inexpensive.

A secondary heater 155, as shown in FIG. 1, may also be advantageously employed. The secondary heater 155 may also be usefully connected via the conductive traces 115 to electrical power which can be applied to more rapidly heat the semiconductor laser 150 to the desired temperature In a preferred implementation, the heater 155 consist of a resistor through which current flows. Such a resistive heater 155 can be used to rapidly heat the laser assembly to the desired temperature in a time short compared to the time required for the laser heat alone to perform this function. After the required temperature is obtained, the secondary heater 155 may be turned off. If the thermal mass of the laser assembly is not too large, the energy penalty incurred in using the secondary heater is small.

The heater 155 is secondary in the sense that temperature control is primarily achieved by the heat sink with adjustable thermal impedance. The secondary heater 155 is used, for example, in initial heating (e.g., during startup) or as a supplement to heating caused by the laser (e.g., if the laser is moved from one operating temperature to another operating temperature). The control circuits 180 can also perform the operation of applying electrical current to any secondary heaters 155.

The laser heat sink 110 may be advantageously chosen to be a flex circuit with a copper ground plane. The heat is conducted through a copper layer of sufficient width and thickness to have low thermal impedance over the designed length, and electrical circuits may be established using the conductive traces 115 on the insulating layers that are part of the flex circuit. That permits straightforward connection of the temperatures sensor, any secondary heater, laser bias current connections, and any monitor photodiode within the laser assembly.

The connection between the control circuits 180 and the laser heat sink 110 should be chosen such that the thermal impedance of these connections is large. This is facilitated if the traces used for establishing circuits are the minimum width and thickness required to carry the necessary currents. Wires of a gauge as small as possible are advantageously used to make the electrical connections between the traces 115 and the control circuits 180. To reduce heat flow, the laser heat sink 110 itself preferably is not attached to the control circuits 180.

In the example of FIG. 1, a temperature sensor 130 is advantageously mounted on the laser assembly. The sensor can be thermistor, or a semiconductor device that produces a voltage from which the temperature can be determined. Alternatively, the wavelength of the laser can be directly measured by some sort of wavelength sensor and used as feedback for the control circuits 180, such that the wavelength of the laser can be set at a previously established target value.

Thermal insulators may be advantageously chosen to be glass, or in a more preferred embodiment glass which is substantially filled with air bubbles.

An example is now presented based on a semiconductor laser which dissipates 200 mW of thermal energy during typical operation, and which has a coefficient of wavelength with temperature of 0.25 nm/° C. Consider a case where it is desired to tune the laser by 5 nm, which corresponds to a temperature rise of 20° C. The laser heat sink 110 is chosen such that its thermal impedance when connected to the second heat sink 120 is approximately 20° C./W. Hence, if always connected, the laser temperature rise will be 4° C. To achieve this thermal impedance, a copper heat sink which is 20 mm long×10 mm wide×0.25 mm thick could be employed, but straightforward heat flow calculations suffice to derive other workable geometries and materials. Dimensions and materials of the insulator can be selected using conventional heat flow calculations in order to obtain a thermal impedance of at least 120° C./W, but preferentially at least 200° C./W. In such a case, and provided all other thermal paths are negligible, the 200 mW laser heating can cause the laser assembly to rise by at least 20° C. above the temperature that would be reached if the heat sinks are always connected. Therefore, in this example, the laser wavelength can be expected to change by at least 5 nm between the cases when the heat sinks are always connected and never connected.

An adequate contact area between the two heat sink portions 110, 120 is desirable when the actuator 170 forces connection such that excessive thermal impedance is not added by a limited contact area. In the example provided, a contact area of 1 mm$^2$ will suffice if the second heat sink 120 is also copper.

If a secondary resistive heater is deployed on the assembly, it is usually preferable to design the device to provide at least as much heat as the laser in order to affect the warm up time appreciably. In the above example, a suitable choice would be a 500 mW heater. For a current of 100 mA, the resistor would be 50 Ohms.

The heat sink portion 110 is desired to elastically deflect when contacted by the actuator 170 and return to its nominal position when contact is withdrawn. In the example provided, a deflection of about 1 mm is sufficient, and the actuator 170 could be chosen to have approximately a deflection of 2 mm. In such a case, the actuator 170 need not be in contact with the heat sink other than when desired, and no heat will flow between the two heat sink portions 110, 120 when the actuator 170 is not extended.

The control circuits 180 in a preferred embodiment enable closed loop control of the temperature. The circuits include a device for reading the output of the temperature sensor 130, and appropriate electronics for ascertaining the time required for connecting the heat sink portions 110, 120. In a preferred embodiment, a microprocessor or an application specific IC with computational capability can be used to perform the function of establishing connection times. There are many possible control algorithms to achieve the desired temperature. One satisfactory way to do this is to estimate the fraction of time the heat sinks should be connected on the basis of the typical variation of temperature as a function of connection time for an adequate sample of assemblies. Individual variability of the assemblies can then be compensated by a microprocessor which will make adjustments to the fraction of time connected, depending on whether the measured temperature from the sensor is either high or low. It is preferred that the heat sinks 110, 120 be disconnected until the laser gets near to the set-point in order to minimize the time required.

In FIG. 1, the control circuits 180 also contain a device to drive the actuator 170. When a secondary heater is employed, another device to supply current to the heater is added to the control circuits.

Figure 2:
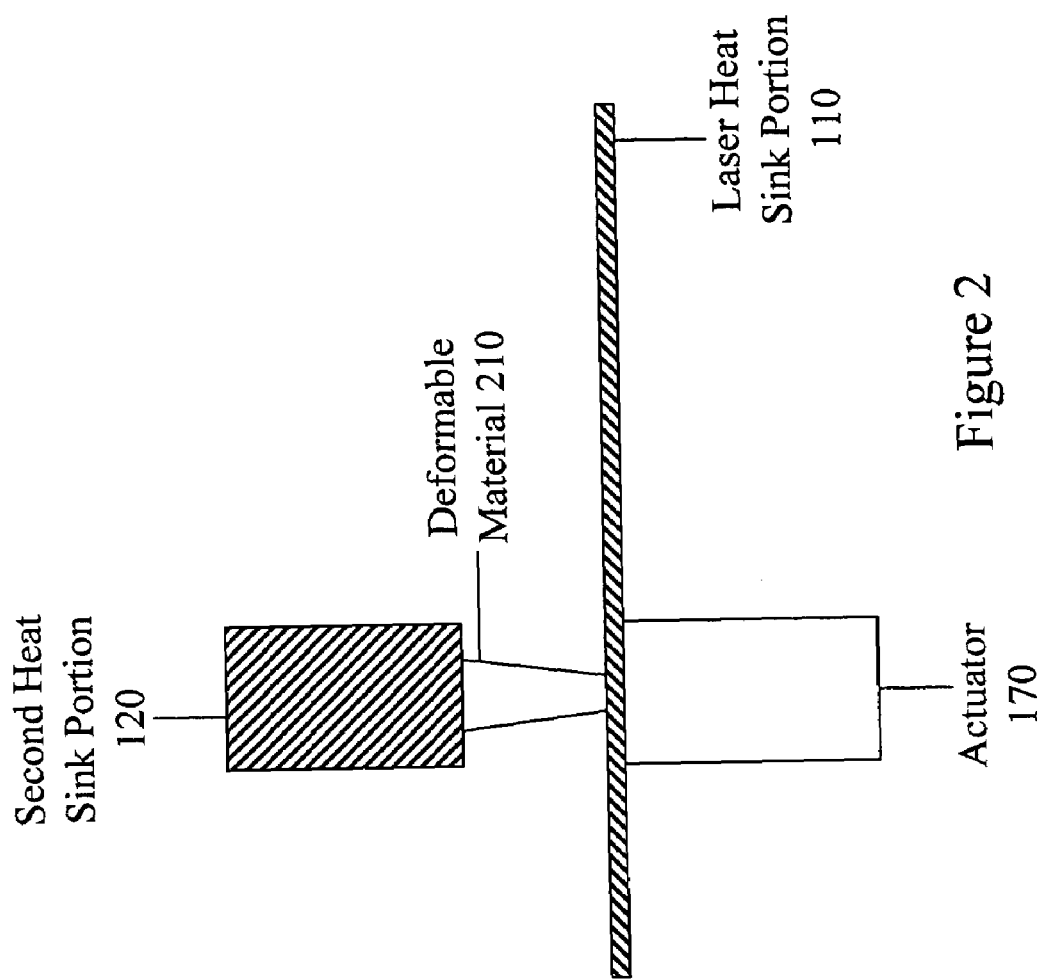
FIG. 2 is a diagram of an apparatus which allows the thermal impedance to be continuously varied through use of a deformable material.

It is also possible to implement a control scheme whereby the thermal impedance is continuously adjustable over a range, rather than using the time average techniques already described. FIG. 2 shows an example where this is accomplished by adjusting the contact area between the laser heat sink 110 and the second heat sink 120, by applying a adjustable force between the two. As shown in FIG. 2, a deformable material 210 is advantageously placed between the two portions 110, 120 of the heat sink such that significant changes in contact area are possible with realistic forces. The material may be advantageously chosen to be a liquid or a solid of low modulus of elasticity. In the case of a liquid, it is necessary to control the spacing between the laser heat sink 110 and second heat sink 120 rather than the force. Liquids can advantageously be chosen to be oil or mercury. Suitable deformable solids can be obtained in the form of spheres. Suitable material choices would include aluminum or copper.

The specific choice of laser assembly, wavelengths and wavelength ranges, form factors, type of heat sink, etc. will depend in part on the application. One class of possible applications is Raman spectroscopy. In these applications, differential wavelength measurements can be useful in accurately extracting fluorescence backgrounds and measurement artifacts. One specific implementation uses the 830 nm laser wavelength from a semiconductor laser. The laser is advantageously mounted in a TO-header type package. The laser may be stabilized advantageously to a precision of <0.2 nm and/or it can be deliberately tuned by approximately 1 nm and spectra may taken before and subsequent to the tuning, for purposes of subtraction.

Another example application is optical communications. For example, a semiconductor laser could have a wavelength in the vicinity of 1550 nm and may also be advantageously mounted in a TO-header type package. In dense wavelength division multiplexing systems, a typical spacing between channels is about 0.8 nm. The approach described above could be used to control the laser to a precision that is finer than the channel spacing, potentially with major savings in power consumption. In the more compact packaging schemes that are becoming prevalent, this is usually highly advantageous.

Although the detailed description contains many specifics, these should not be construed as limiting the scope of the invention but merely as illustrating different examples and aspects of the invention. It should be appreciated that the scope of the invention includes other embodiments not discussed in detail above. Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents.

The invention claimed is:

1. An apparatus for tuning a wavelength of a semiconductor laser comprising:
    a semiconductor laser, wherein a wavelength of an optical beam produced by the semiconductor laser varies as a function of a temperature of the semiconductor laser;
    an adjustable heat sink thermally coupled to the semiconductor laser, the heat sink having an adjustable thermal impedance, wherein a temperature of laser varies according to $\theta \Delta W + \Delta T$, wherein $\theta$ is the thermal impedance of the heat sink and $\Delta W$ is change in power consumption and $\Delta T$ is change in temperature of the heat sink, and for substantially constant temperature of the heat sink, the temperature of the laser is adjustable by adjusting $\theta$, the heat sink comprising
    a first heat sink portion thermally coupled to the semiconductor laser; and
    a second heat sink portion capable of being switchably thermally coupled or decoupled to the first heat sink portion; and
    a controller for adjusting the thermal impedance of the heat sink by adjusting a duty cycle of the thermal coupling of the second heat sink portion to the first heat sink portion to maintain the wavelength of the optical beam at a given wavelength.

2. The apparatus of claim 1 wherein the temperature of the semiconductor laser is determined primarily by heat generated by the semiconductor laser and the thermal impedance of the heat sink.

3. The apparatus of claim 1 wherein the semiconductor laser is not actively heated or cooled by an external device to maintain the wavelength of the optical beam at a given wavelength.

4. The apparatus of claim 1 wherein transfer of heat generated by the semiconductor laser occurs primarily through the heat sink.

5. The apparatus of claim 1 further comprising:
    a secondary heater, wherein the controller activates the heater for initial heating of the semiconductor laser.

6. The apparatus of claim 1 further comprising:
    a secondary heater, wherein the controller activates the heater for supplemental heating of the semiconductor laser.

7. The apparatus of claim 6 wherein the secondary heater comprises a resistive heater.

8. The apparatus of claim 1 wherein the controller comprises a processor.

9. The apparatus of claim 1 further comprising:
    a temperature sensor for sensing a temperature of the semiconductor laser, wherein the controller is coupled to the temperature sensor and adjusts the thermal impedance of the heat sink to maintain the temperature of the semiconductor laser at a temperature that corresponds to the given wavelength.

10. The apparatus of claim 1 further comprising:
    a wavelength sensor for sensing a wavelength of the optical beam, wherein the controller is coupled to the wavelength sensor and adjusts the thermal impedance of the heat sink to maintain the wavelength of the optical beam at the given wavelength.

11. An apparatus for tuning a wavelength of a semiconductor laser comprising:
a semiconductor laser, wherein a wavelength of an optical beam produced by the semiconductor laser varies as a function of a temperature of the semiconductor laser;
a heat sink thermally coupled to the semiconductor laser, the heat sink comprising
a first heat sink portion thermally coupled to the semiconductor laser;
a second heat sink portion capable of being switchably thermally coupled or decoupled to the first heat sink portion; and
an actuator for making and breaking mechanical contact between the first heat sink portion and the second heat sink portion, thereby switchably thermally coupling and decoupling the first heat sink portion and the second heat sink portion;
a controller for adjusting the thermal impedance of the heat sink by adjusting a duty cycle of the thermal coupling of the second heat sink portion to the first heat sink portion to maintain the wavelength of the optical beam at a given wavelength.

12. The apparatus of claim 11 wherein the actuator comprises a solenoid.

13. The apparatus of claim 12 wherein the solenoid is latching in a contacting position and/or a non-contacting position.

14. An apparatus for tuning a wavelength of a semiconductor laser comprising:
a semiconductor laser, wherein a wavelength of an optical beam produced by the semiconductor laser varies as a function of a temperature of the semiconductor laser;
a heat sink thermally coupled to the semiconductor laser, the heat sink comprising a first heat sink portion thermally coupled to the semiconductor laser; and
a second heat sink portion in thermal contact with the first heat sink portion, wherein an area of the thermal contact is adjustable over a range of areas; and
a controller for adjusting the thermal impedance of the heat sink to maintain the wavelength of the optical beam at a given wavelength, and wherein the controller adjusts the thermal impedance of the heat sink by adjusting the area of the thermal contact.

15. The apparatus of claim 14 further comprising:
a deformable material forming the area of thermal contact.

16. The apparatus of claim 15 wherein the deformable material is a liquid.

17. The apparatus of claim 15 wherein the deformable material is spherical in shape.

18. An apparatus for tuning a wavelength of a semiconductor laser comprising:
a semiconductor laser, wherein a wavelength of an optical beam produced by the semiconductor laser varies as a function of a temperature of the semiconductor laser;
a heat sink having an adjustable thermal impedance, the heat sink comprising a second heat sink portion; and
a first heat sink portion thermally coupling the semiconductor laser to the second heat sink portion, wherein the first heat sink portion is otherwise thermally insulated by glass partially filled with air; and
a controller for adjusting the thermal impedance of the heat sink to maintain the wavelength of the optical beam at a given wavelength.

19. An apparatus for tuning a wavelength of a semiconductor laser comprising:
a semiconductor laser, wherein a wavelength of an optical beam produced by the semiconductor laser varies as a function of a temperature of the semiconductor laser;
a heat sink having an adjustable thermal impedance, the heat sink comprising
a first heat sink portion thermally coupled to the semiconductor laser, wherein the first heat sink portion is part of an integrated assembly also comprising conductive traces for making electrical connection to the semiconductor laser; and
a second heat sink portion capable of being adjustably thermally coupled to the first heat sink portion; and
a controller for adjusting the thermal impedance of the heat sink to maintain the wavelength of the optical beam at a given wavelength.

20. The apparatus of claim 19 wherein the first heat sink portion comprises a copper layer of a flex circuit.

21. The apparatus of claim 1 wherein the wavelength of the optical beam is adjustable over a range of wavelengths.

22. The apparatus of claim 21 wherein the range of wavelengths spans at least 1.0 nm.

23. An apparatus for controlling a temperature of a semiconductor laser comprising:
a semiconductor laser;
an adjustable heat sink thermally coupled to the semiconductor laser, the heat sink having an adjustable thermal impedance, wherein a temperature of laser varies according to $\theta \Delta W + \Delta T$, wherein $\theta$ is the thermal impedance of the heat sink and $\Delta W$ is the change in power consumption and $\Delta T$ is change in temperature of the heat sink, and for substantially constant temperature of the heat sink, the temperature of the laser is adjustable by adjusting $\theta$, the heat sink comprising
a first heat sink portion thermally coupled to the semiconductor laser, and
a second heat sink portion capable of being switchably thermally coupled or decoupled to the first heat sink portion; and
a controller for adjusting the thermal impedance of the heat sink by adjusting a duty cycle of the thermal coupling of the second heat sink portion to the first heat sink portion to maintain the temperature of the semiconductor laser at a given temperature.

24. The apparatus of claim 23 wherein the given temperature is adjustable over a temperature range of at least 1° C.

* * * * *